(12) United States Patent
Doyle et al.

(10) Patent No.: US 7,491,965 B2
(45) Date of Patent: *Feb. 17, 2009

(54) HEAT-SHIELDED LOW POWER PCM-BASED REPROGRAMMABLE EFUSE DEVICE

(75) Inventors: James P. Doyle, Bronx, NY (US); Bruce G. Elmegreen, Golden Bridge, NY (US); Lia Krusin-Elbaum, Dobbs Ferry, NY (US); Chung Hon Lam, Peekskill, NY (US); Xiao Hu Liu, Briarcliff Manor, NY (US); Dennis M. Newns, Yorktown Heights, NY (US); Christy S. Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/127,994

(22) Filed: May 28, 2008

(65) Prior Publication Data

US 2008/0224118 A1  Sep. 18, 2008

Related U.S. Application Data

(63) Continuation of application No. 11/467,294, filed on Aug. 25, 2006.

(51) Int. Cl.
*H01L 47/00* (2006.01)
(52) U.S. Cl. .............................. 257/4; 257/209; 257/529; 257/E29.17
(58) Field of Classification Search .................... 257/4, 257/209, 529, E29.17
See application file for complete search history.

(56) References Cited

U.S. PATENT DOCUMENTS

| 6,448,576 | B1 | 9/2002 | Davis et al. |
| 6,970,034 | B1 | 11/2005 | Harris |
| 7,208,751 | B2 | 4/2007 | Ooishi |
| 2005/0121789 | A1 | 6/2005 | Madurawe |
| 2005/0188230 | A1 | 8/2005 | Bilak |
| 2006/0278895 | A1 | 12/2006 | Burr et al. |

(Continued)

OTHER PUBLICATIONS

Exploring Potential Benefits Of 3D FPGA Integration, pp. 1-6.

(Continued)

*Primary Examiner*—Evan Pert
*Assistant Examiner*—Tan N Tran
(74) *Attorney, Agent, or Firm*—Cantor Colburn LLP; Ido Tuchman

(57) ABSTRACT

An electrically re-programmable fuse (eFUSE) device for use in integrated circuit devices includes an elongated heater element, an electrically insulating liner surrounding an outer surface of the elongated heater element, corresponding to a longitudinal axis thereof, leaving opposing ends of the elongated heater element in electrical contact with first and second heater electrodes. A phase change material (PCM) surrounds a portion of an outer surface of the electrically insulating liner, a thermally and electrically insulating layer surrounds an outer surface of the PCM, with first and second fuse electrodes in electrical contact with opposing ends of the PCM. The PCM is encapsulated within the electrically insulating liner, the thermally and electrically insulating layer, and the first and second fuse electrodes.

17 Claims, 23 Drawing Sheets

U.S. PATENT DOCUMENTS

| | | |
|---|---|---|
| 2006/0279978 A1 | 12/2006 | Krusin-Elbaum et al. |
| 2007/0099405 A1 | 5/2007 | Olivia et al. |
| 2007/0295948 A1 | 12/2007 | Lam et al. |
| 2008/0017842 A1 | 1/2008 | Happ et al. |

OTHER PUBLICATIONS

Aoki et al., Temperature Dependence Of TaSiN Thin Film Resistivity From Room Temperature To 900 Degrees, Jpn. J. Appl. Phys., Jun. 15, 2001, pp. L603-L605, vol. 40, The Japan Society Of Applied Physics, Japan.

Volkert et al., Modeling Of Laser Pulsed Heating And Quenching In Optical Data Storage Media, Journal Of Applied Physics, Aug. 15, 1999, pp. 1808-1816, vol. 86, No. 4, American Institute Of Physics.

Lu Cheng et al., Experimental And Theoretical Investigations Of Laser-Induced Crystallization And Amoerphization In Phase-Change Optical Recording Media, Journal Of Applied Physics, Nov. 1, 1997, pp. 4183-4191, vol. 82, No. 9, American Institute Of Physics.

C.J. Tymczak and John R. Ray, Asymetric Crystallization and Melting Kinetics In Sodium: A Molecular-Dynamics Study, Physical Review Letters, Mar. 12, 1990, pp. 1278-1281, vol. 64, No. 11, The American Physical Society.

Erwin R. Meinders and Martjin H. R. Lankhorst, Determination Of The Crystallization Kinetics Of Fast-Growth Phase-Change Materials For Mark-Formation Prediction, Jpn. J. Appl. Phys., Feb. 2003, pp. 809-812, vol. 42, No. 2B, The Japan Society Of Applied Physics.

C.A. Angell, Formation Of Glasses From Liquids And Biopolymers, Science, Mar. 31, 1995, pp. 1924-1934, vol. 267.

L. Van Pieterson, M.H.R. Lankhorst, M. Van Schijndel, A.E. Kuiper and J.H.J. Roosen, Phase-Change Recording Materials With A Growth-Dominated Crystallization Mechanism: A Materials Overview, Journal Of Applied Physics, 2005, pp. 1-7, American Institute Of Physics.

What Are CPLDs And FPGAs?, file://C:\Docume~1\Admini~\Locals~1\Temp\V9K43UPW.htm, Jul. 20, 2005, pp. 1-3.

J. Maimon et al., Chalcogenide-Based Non-Volitile Memory Technology, IEEE, 2001, pp. 5-2289-5-2294.

Young-Tae Kim et al., Study On Cell Characteristics Of PRAM Using The Phase-Change Simulation, IEEE, 2003, pp. 211-214.

S. Tyson et al., Nonvolitile, High Density, High Performance Phase-Change Memory, IEEE, 2000, pp. 385-390.

C.J. Glassbreenner et al., Thermal Conductivity Of Silicon And Geranium From 3 K To The Melting Point*, Physical Review, May 18, 1964, pp. A1058-A1069, vol. 134, No. 4A.

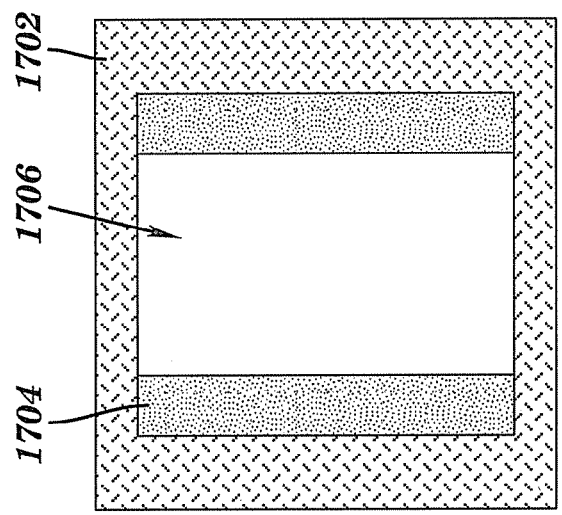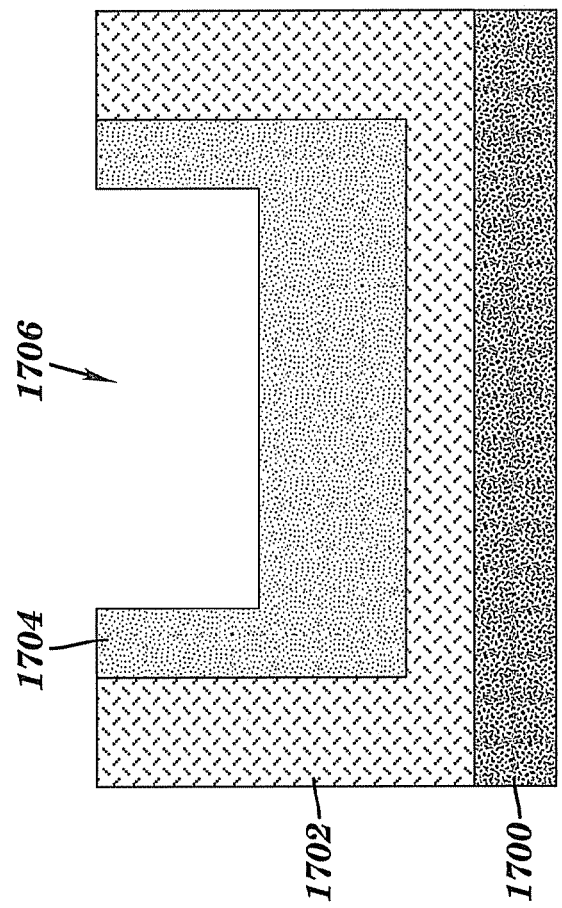
FIG. 18(a)
FIG. 18(b)

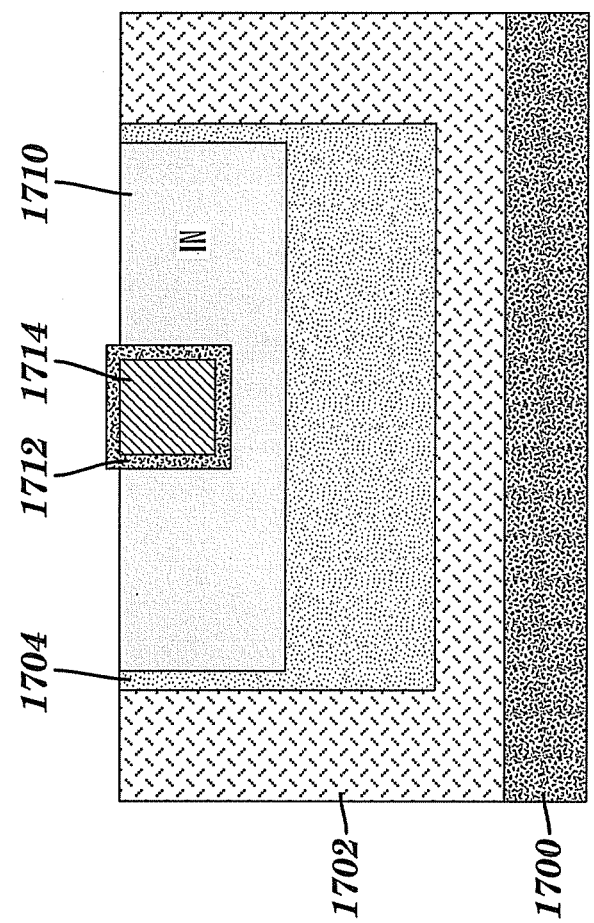
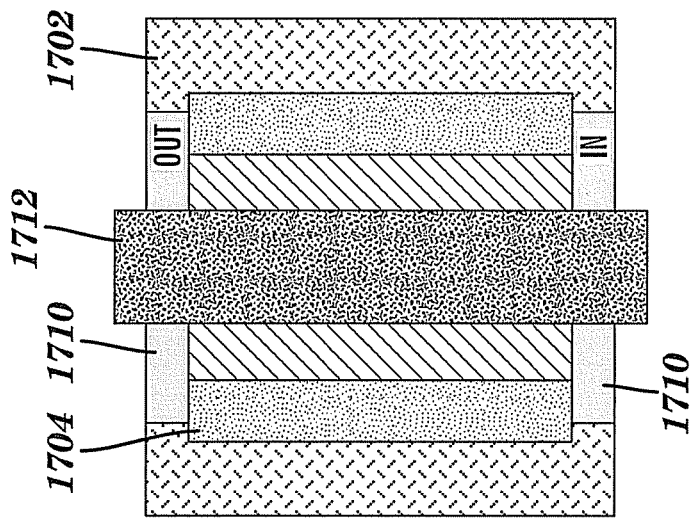
FIG. 22(a)
FIG. 22(b)

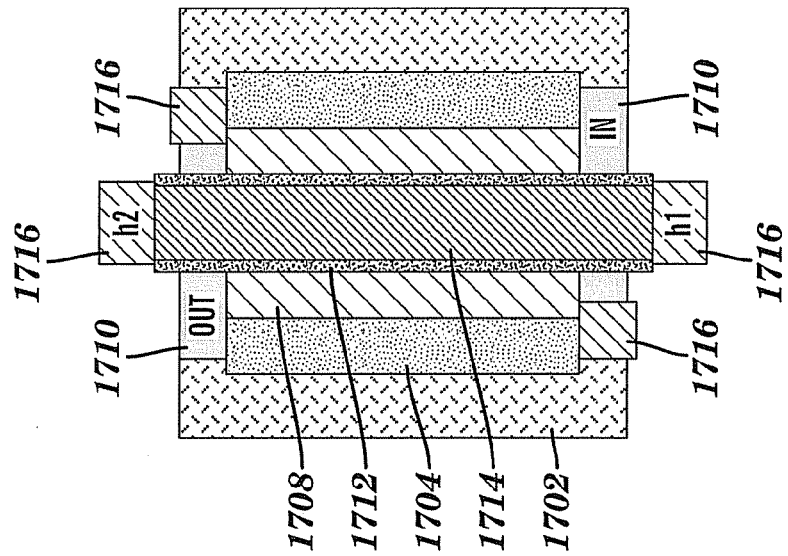
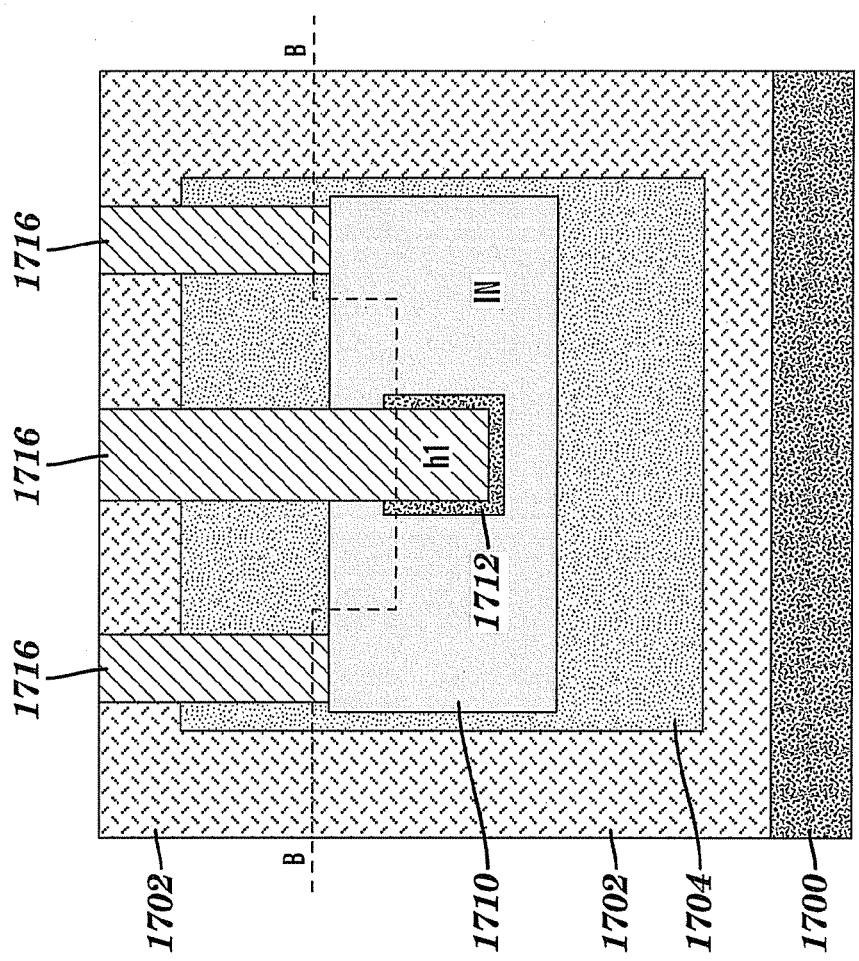
FIG. 26(a)
FIG. 26(b)

HEAT-SHIELDED LOW POWER PCM-BASED REPROGRAMMABLE EFUSE DEVICE

CROSS-REFERENCE TO RELATED APPLICATION

This application is a continuation of U.S. patent application Ser. No. 11/467,294, filed Aug. 25, 2006, the disclosure of which is incorporated by reference herein in its entirety.

BACKGROUND

The present invention relates generally to electrically programmable fuse (eFUSE) devices for integrated circuits and, more particularly, to a heat-shielded, phase change material (PCM) based reprogrammable fuse device with low power requirements.

The post-fabrication repair of logic and memory circuits using programmable fuses is an instrumental capability that currently supports acceptable yield in microchip technology. Future extensions of this repair capability toward full Built-in-Self Test (BIST) will likely require even more intensive development and use of eFUSEs, which in turn may result in the need for such devices to be reprogrammable (i.e., "multishot"), in contrast to the single shot fuses in current use. The more extensive use of eFuse technology in BIST may also result in the demand for a fuse having a lower footprint and a higher switching speed.

Fuse-based repair technology presently relies on several methods to make ("fuse") or break ("antifuse") electrical connections in fabricated structures. For example, laser-fusible links represent an early approach, which are now replaced by electrical techniques entirely internal to the chip. In addition, electromigration fuses (such as in IBM's eFUSE technology for rerouting chip logic), are currently in use. An electromigration fuse takes up a relatively large area and requires a high current to blow the fuse. Also, an electromigration fuse is "one-shot," in that once the fuse is blown, it cannot be returned to a conducting state. Furthermore, the variation of eFUSE characteristics is relatively broad, thus requiring that the state of each fuse be sensed by a discriminating circuit with the digital result stored in a latch. The blowing of an electromigration fuse is also a relatively slow, on the order of about 200 µs, for example.

In contrast, an anti-fuse approach (e.g., used for some DRAM repair operations) typically involves a very thin dielectric material such as silicon dioxide, or a sandwich combination of silicon oxide-nitride-oxide (ONO), between two conductors. The anti-fuse is programmed by applying a relatively high voltage through the conducting terminals, causing dielectric breakdown in the dielectric, when the resistance of the anti-fuse permanently changes from high to low. This is also a one-shot technique requiring high voltage.

Unfortunately, the existing controllable link technologies described above may not have optimal properties for future microchip generations, due to factors such as: excessive area taken up by the fuse, "sunsetting" of the non-standard high voltages/currents which may be required by fuse programming, the desirability of "multishot" reprogrammable fuses, and insufficient speed for future BIST.

Reprogrammable fuses utilizing chalcogenide materials (and indirect heating through a resistive heater) are described in U.S. Pat. No. 6,448,576 to Davis et al. However, the use of such reprogrammable fuses as described in the '576 patent are essentially confined to locations in the lower logic layer of the device, on the semiconductor substrate, as only the materials (e.g., silicon, oxides, metals) used in the logic layer can tolerate the high temperatures (e.g., on the order of about 1000° C.) that result during chalcogenide switching.

However, the material corresponding to the location of existing eFUSEs in the top areas (back-of-the-line section) of the chip differs from logic level devices, in that low-K material is typically used as the insulating material between the conducting lines and vias. This type low-K material is heat sensitive (e.g., unable to support more than 400° C.), thus severely constraining the use of heat-driven devices where the maximum device temperature during programming can reach 1000° C., even for very short durations. Moreover, because such chalcogenide fuse materials in the '576 patent emit large amounts of heat, it is estimated that switching currents needed to produce the required heat are on the order of about 15 mA. Under this assumption, a required heater current of 15 mA would in turn result in a design that is inconveniently large, requiring a driver FET width on the order of about 15 microns.

Accordingly, it would therefore be desirable to provide a reprogrammable fuse (eFUSE) suitable for BIST applications, wherein the devices may be located in the back-end-of-line (BEOL) regions of a semiconductor device.

SUMMARY

The foregoing discussed drawbacks and deficiencies of the prior art are overcome or alleviated by an electrically re-programmable fuse (eFUSE) device for use in integrated circuit devices. In an exemplary embodiment, the device includes an elongated heater element, an electrically insulating liner surrounding an outer surface of the elongated heater element, corresponding to a longitudinal axis thereof, leaving opposing ends of the elongated heater element in electrical contact with first and second heater electrodes. A phase change material (PCM) surrounds a portion of an outer surface of the electrically insulating liner, a thermally and electrically insulating layer surrounds an outer surface of the PCM, with first and second fuse electrodes in electrical contact with opposing ends of the PCM. The PCM is encapsulated within the electrically insulating liner, the thermally and electrically insulating layer, and the first and second fuse electrodes.

In another embodiment, an integrated circuit device includes an electrically re-programmable fuse (eFUSE) device formed within a back end of line (BEOL) region of the integrated circuit device. The eFUSE device further includes an elongated heater element, an electrically insulating liner surrounding an outer surface of the elongated heater element, corresponding to a longitudinal axis thereof, leaving opposing ends of the elongated heater element in electrical contact with first and second heater electrodes. A phase change material (PCM) surrounds a portion of an outer surface of the electrically insulating liner, a thermally and electrically insulating layer surrounds an outer surface of the PCM, and first and second fuse electrodes are in electrical contact with opposing ends of the PCM. The PCM is encapsulated within the electrically insulating liner, the thermally and electrically insulating layer, and the first and second fuse electrodes so as to protect dielectric material within the BEOL region from operating temperatures generated by the heater element as a result of programming of the eFUSE device.

In still another embodiment, a method of forming an electrically re-programmable fuse (eFUSE) device for use in integrated circuit devices includes surrounding an outer surface of an elongated heater element, along a longitudinal axis thereof, with an electrically insulating liner so as to leave opposing ends of the elongated heater element in electrical contact with first and second heater electrodes; surrounding a portion of an outer surface of the electrically insulating liner with a phase change material (PCM); surrounding an outer surface of the PCM with a thermally and electrically insulating layer; and forming first and second fuse electrodes in electrical contact with opposing ends of the PCM. The PCM is encapsulated within the electrically insulating liner, the thermally and electrically insulating layer, and the first and second fuse electrodes, and wherein the first and second heater electrodes are electrically insulated from the first and second fuse electrodes.

BRIEF DESCRIPTION OF THE DRAWINGS

Referring to the exemplary drawings wherein like elements are numbered alike in the several Figures:

FIGS. 17 through 26 are a series of alternative process flow diagrams illustrating exemplary integration techniques through which a PCM-based eFUSE device may be fabricated within a BEOL region of a semiconductor device, in accordance with an alternative embodiment of the invention.

DETAILED DESCRIPTION

Disclosed herein is an eFUSE device and method of manufacturing the same that employs the switching properties of more newly available phase change materials (PCM). In an exemplary embodiment, the phase change material is a ternary alloy of germanium (Ge), antimony (Sb) and tellurium (Te) (GST), with an exemplary composition of $Ge_2Sb_2Te_5$. However, other compositions such as $GeSb_4$, (including substitution/addition of other elements) are also contemplated.

Figure 1:
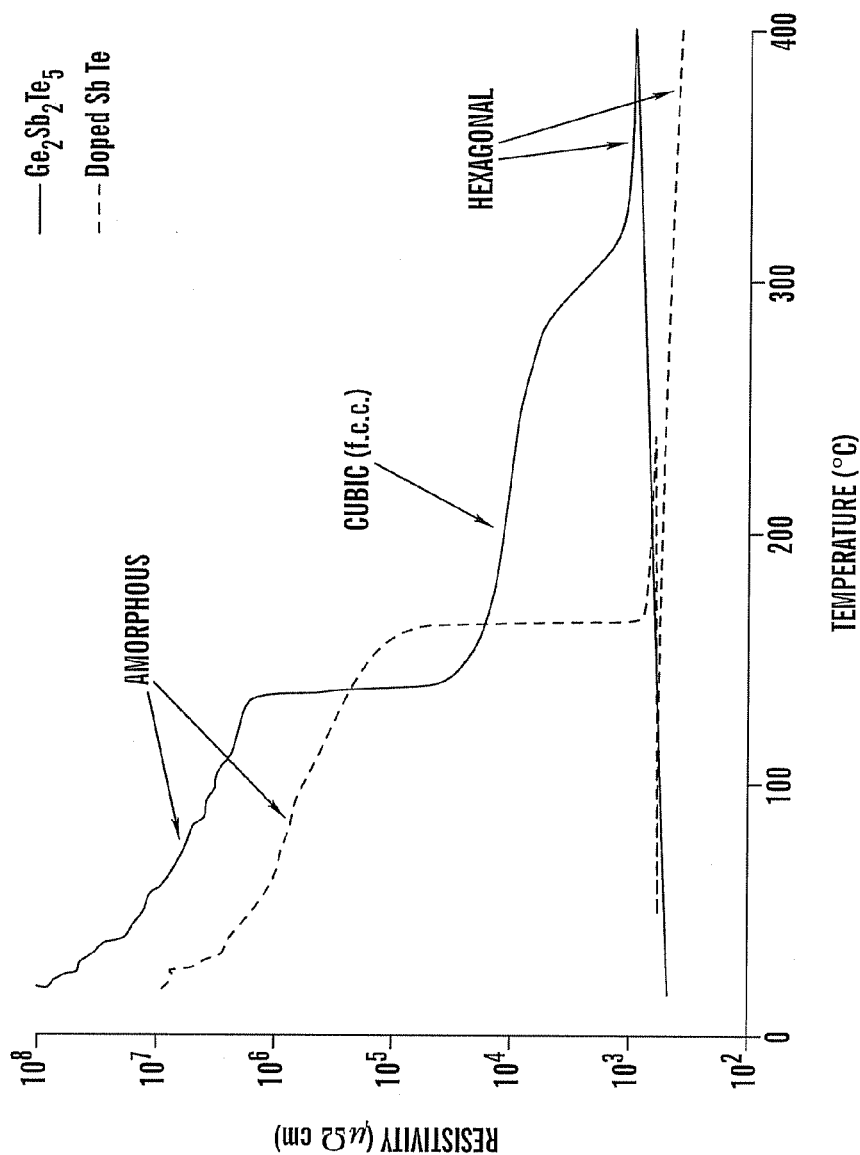
FIG. 1 is a graph illustrating temperature-controlled transitions of phase change materials between amorphous and crystalline (cubic and hexagonal) phases, and the resistivities associated therewith.
Figure 2:
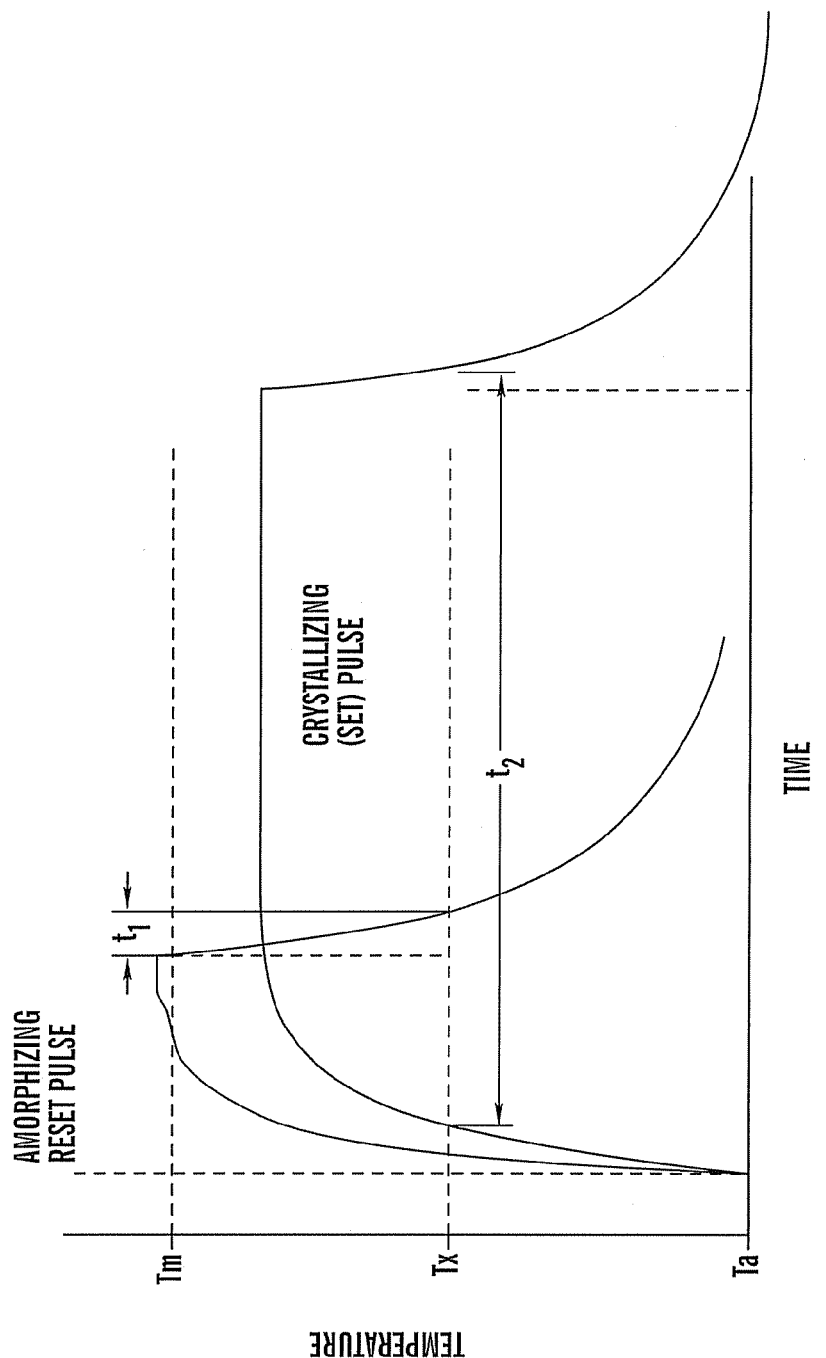
FIG. 2 is a graph illustrating exemplary thermal cycling operations of a phase change material used in an eFUSE device, in accordance with an embodiment of the invention.

At room temperature (and up to moderately elevated temperatures) the PCM is stable in two phases: amorphous and crystalline (both cubic and hexagonal). These phases have significantly different resistivities associated therewith, as shown in the graph of FIG. 1. Specifically, the crystalline phase is a moderately good conductor of electricity, while the amorphous phase of PCM is insulating. However, the amorphous phase may be converted into the crystalline phase by a relatively slow anneal (referred to as a SET process) at a moderate temperature, as shown in the graph of FIG. 2. Conversely, the crystalline phase may be converted into the amorphous phase (referred to as a RESET process) by raising the transformable portion of the PCM to the melt temperature, followed by a fast quench (on a nanosecond time scale), as also shown in FIG. 2. As a result of the rapid quench, the disordered arrangement of atoms of the PCM due to the melt is retained.

As described herein, a PCM fuse structure provides a programmable device that may operate within the realm of the heat-sensitive upper wiring layers of a chip, and with the superior control of a 4-terminal design. In addition, the fuse embodiments described herein can operate at significantly lower power levels than with respect to the device disclosed in the '576 patent discussed above, and are eminently scalable. Briefly stated, the fuse embodiments of the present disclosure incorporate features, such as heater location within a central core and the provision of heat shielding (which, as shown by simulations, maintains the temperature of the thermally sensitive low-K material below the point of material degradation).

Further, a feature of the fuse embodiments described herein is a 4-terminal design in which the heater terminals and fuse input/output terminals are electrically isolated from one another, an arrangement that provides improved control and programming capability. By way of example, an embodiment of the present fuse design utilizes a heater current on the order of about of 2 mA or less (as determined by detailed numerical simulations), and has a potential for further reduction with dimensional scale-down. Such capabilities are facilitated through nesting of the structural components in an "onion skin" manner, in which the indirect heater resistor is sheathed/buried within the PCM. In turn, the heater is surrounded by layers of low-thermal conductivity dielectric and appropriately located heat sinks formed from a metal material with good thermal conductivity. Through the effective selection of thermal boundaries and materials with proper thermal diffusivity, numerous advantages are achieved over existing electromigration fuse technology.

Figure 3:
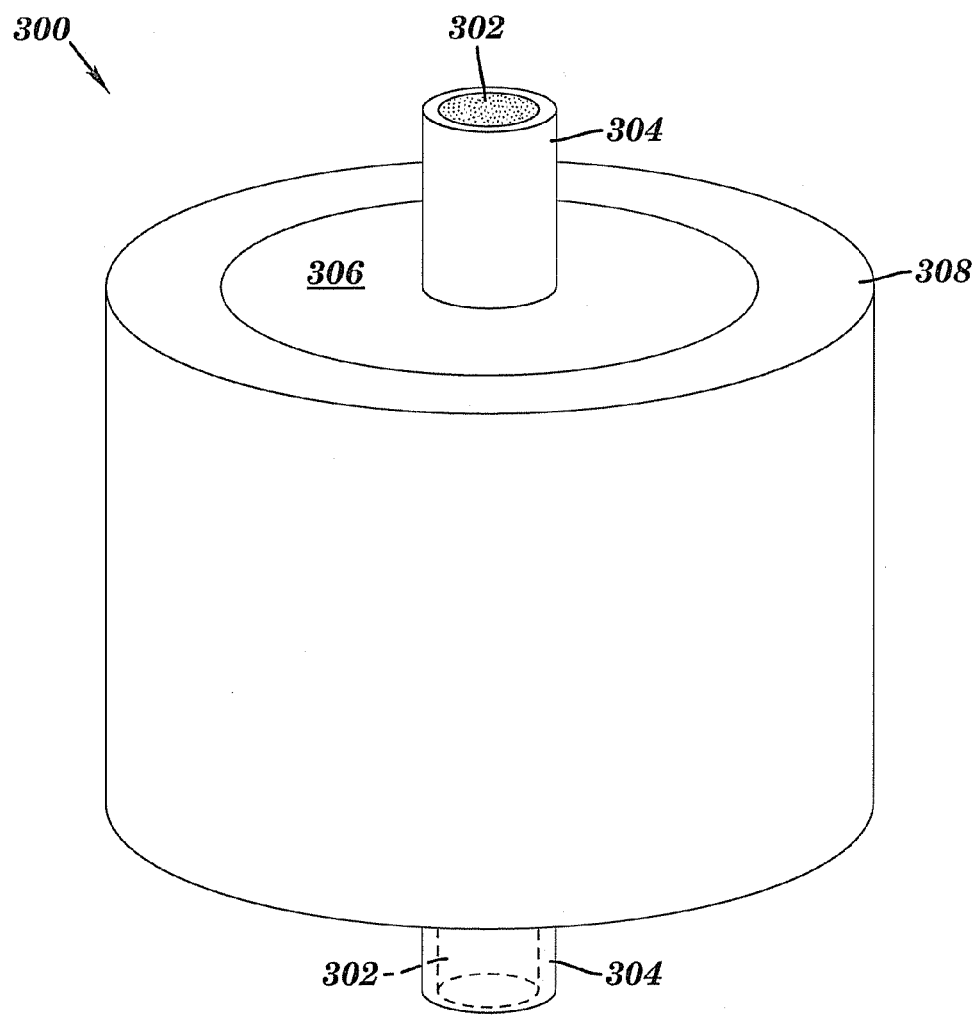
FIG. 3 is a perspective cutaway view of a PCM-based eFUSE device, in accordance with an embodiment of the invention.
Figure 4:
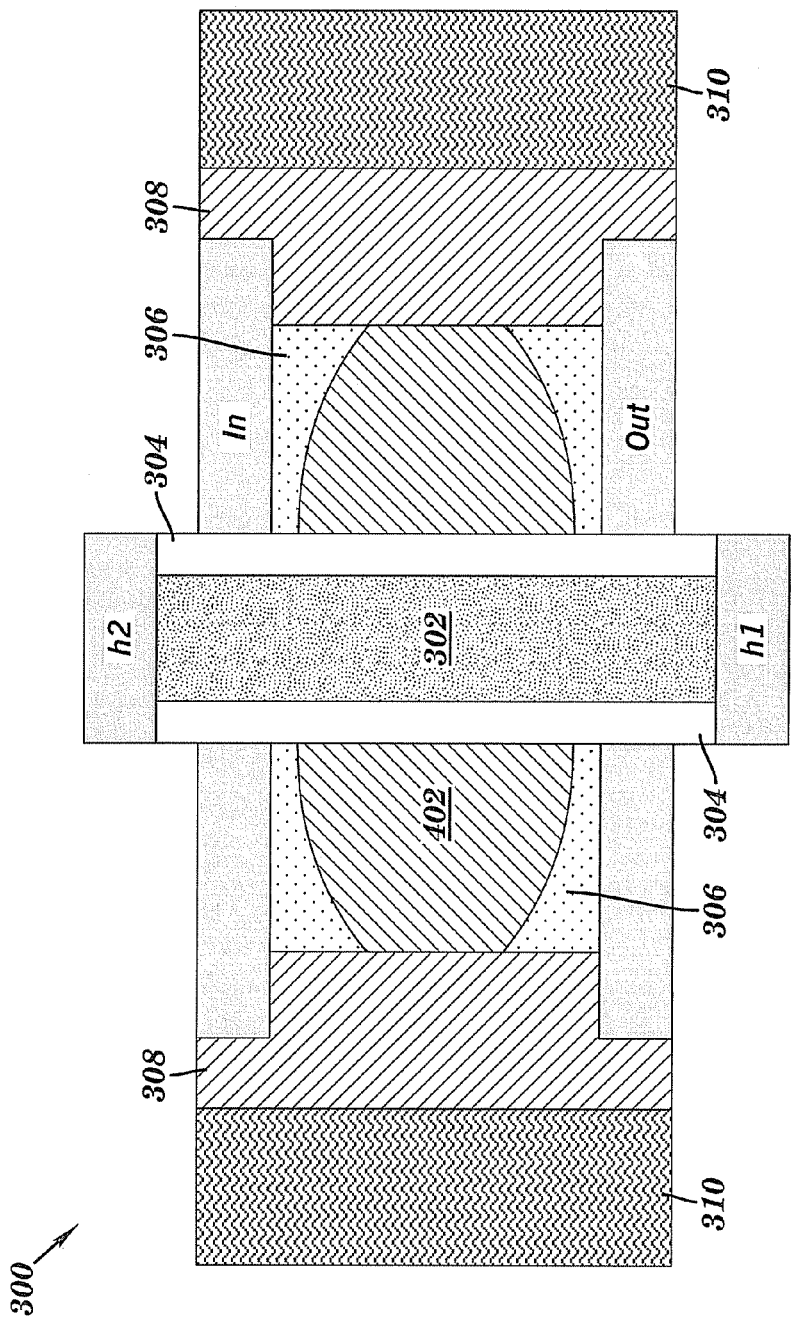
FIG. 4 is a cross sectional view of the PCM-based eFUSE device of FIG. 3, including depiction of exemplary electrode and low-K dielectric material locations.

Referring now to FIGS. 3 and 4, there is shown (respectively) a perspective view and a sectional view of a PCM-based eFUSE device 300, in accordance with an embodiment of the invention. In the embodiment depicted, the fuse structure is depicted as having a cylindrical symmetry (although a planar nested structure is also contemplated, as discussed later). Proceeding radially outward from the center of the structure, the device 300 includes a elongated heater 302, a thin electrically insulating layer 304 surrounding the heater 302 along a longitudinal axis thereof (except for the outer ends thereof) to electrically isolate the heater 302 from the rest of the system, a cylindrical shell of active PCM 306 surrounding the insulating layer 304, a thermal and electrical insulator material layer 308 surrounding the PCM 306, and an enveloping low-K material 310 (not shown in FIG. 3). As particularly shown in FIG. 4, a first set of electrodes h1 and h2 connect to the heater 302 in the axial direction, while a second set of electrodes "In" and "Out" connect to the ends of the cylindrical shell of PCM 306.

A heat sink is effectively formed by radial extension of the PCM electrodes "In" and "Out," such that the PCM 306 is encapsulated by the combination of the insulating layer 304, the thermal and electrical insulator 308, and the PCM (fuse) electrodes "In" and "Out." It has been determined that if the sink is further extended to form a cylinder or partial cylinder surrounding the device, the result is excessive heat conduction with difficulty in reaching the temperatures required for fuse operation. Accordingly, the top and bottom disk sinks illustrated in FIG. 4 (i.e., electrodes "In" and "Out"), which are nominally maintained at ambient temperature, are adequate in controlling the radial spread of temperature, while also permitting efficient device operation.

The operation of the PCM based eFUSE device of FIGS. 3 and 4 will be understood as follows. With the bulk of the PCM shell 306 in the crystalline state, there is a relatively low resistance between the "In" and "Out" terminals. Application of the electrical RESET pulse (as described above) to the heater terminals h1 and h2 results in a melt region spreading out from the heater core, which upon quenching becomes an amorphous region 402. The amorphous region 402 has high resistivity and blocks the current path between the "In" and "Out" terminals, thus the device is in the electrically non-conducting OFF state after RESET. Conversely, the application of a lower-temperature, slower SET pulse returns the system to the crystalline, electrically-conducting ON state.

Figure 5:
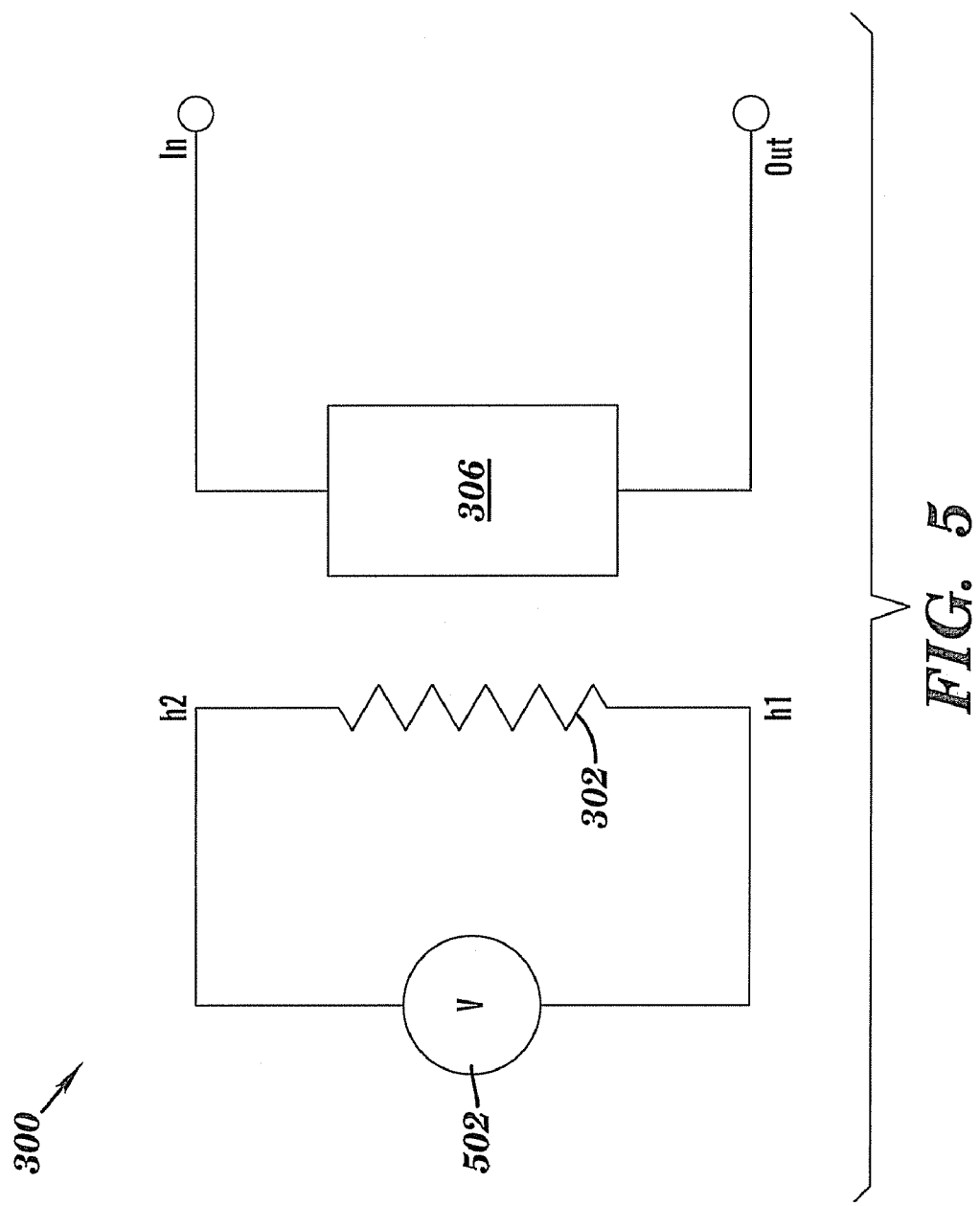
FIG. 5 is an equivalent circuit diagram of the eFUSE device of FIGS. 3 and 4.

FIG. 5 is a schematic diagram depicting an equivalent circuit of the eFUSE device 300 of FIGS. 3 and 4, particularly illustrating the independent heater and PCM circuits, which is a desirable and convenient arrangement for eFUSE applications. The heater power utilized for the RESET operation is on the order of about 1.3 mW through simulation, with less power utilized for the SET operation. Programming of the eFUSE 300 (as part of a BIST protocol, for example) is implemented by applying an appropriate electrical pulse from voltage source 502 to the electrodes h1, h2 of the input terminals of the heater 302. The resistance seen across the eFUSE terminals "In" and "Out" may be set to a high value by applying a large voltage pulse V for a short time period (which makes the PCM 306 amorphous), and set to a low value by applying a longer, lower magnitude voltage pulse (which makes the PCM 306 crystalline).

Exemplary device dimensions may be on the order of about: 25-80 nm for the heater radius; 5-10 nm for the electrical insulator (e.g., oxide) thickness; 20-80 nm for the PCM thickness; and 200-500 nm for the overall device height. However, the disclosure should not be construed in a limiting sense in this regard. As a specific example, simulation dimensions for the device include a heater radius of 50 nm, an oxide thickness of 5 nm, a PCM thickness of 25 nm, device height 400 nm. With a defined external boundary condition of 300 K, the maximum radius of the 350° C. contour (representing a temperature front of the PCM during a temperature induced phase change operation) is about 135 nm. Thus, the device radius (i.e., the distance between the center of the heater core 302 and the interface between the thermal/electrical insulator material 308 and the low-K material 306) will be about 270 nm in this example.

With regard to material selection, the heater 302 may be fabricated from a refractory material such as TaSiN, for example, with an electrical resistivity at the metallic/semiconductor boundary of about (for example) $1.5 \times 10^{-3} \Omega \cdot cm$. This will allow for a heater power of 1.3 mW (the power corresponding to the RESET operation estimated from the simulation) to be achieved at a voltage of 1.0 V. In the case of TaSiN, the resistivity thereof decreases slightly with increasing temperature, and is tunable by composition. $SiO_2$ is a suitable material for the thin, electrically insulating layer 304, which should provide adequate electrical insulation for the heater at an exemplary thickness of about 5 nm. The PCM material 306 is of a low-resistivity type, such as $GeSb_4$, for example. Taking the crystalline resistivity of $GeSb_4$ as $5 \times 10^{-4} \Omega \cdot cm$, and its amorphous resistivity as $1.0 \Omega \cdot cm$, the "ON" and "OFF" resistances for the fuse device 300 are estimated as $200\Omega$ and $4.0 \times 10^5 \Omega$, respectively.

In addition to providing electrical insulation, the layer 308 is also designed to be thermally insulating as well. Accordingly, a material such as N-BLoK® (Si—C—H—N compound) provides better thermal insulation than oxide, having about one half the thermal conductivity of $SiO_2$ (e.g., about 0.008 Watt $cm^{-1}$ $K^{-1}$ or less). The fuse device design maintains it well below its maximum operating temperature of about 1000° C. Materials alternative to N-BLoK which also have low thermal and electrical conductivity, and can withstand temperatures of about 1000° C. are also acceptable.

As will be appreciated, the above described exemplary embodiment of the eFUSE device 300 is advantageous over existing devices in a variety of aspects. For instance, the area taken up by the device 300 can be very small (e.g., about $0.3 \times 0.3$ $\mu m^2$). The heater 302 which programs the device 300 may be operated using standard I/O voltage supplies. Whereas a conventional electromigration fuse requires a programming current of about 10 mA, the present PCM-based structure uses only about 2 mA, with programming carried out at about 500 ns or less (compared to about 200 μs for the electromigration fuse). Moreover, unlike a one-shot electromigration fuse, the PCM-based fuse 300 may be reprogrammed on the order of about $10^{11}$ times.

Furthermore, the interface between the PCM 306 and the metal electrodes is relatively robust, in that it is kept close to room temperature and thus is not subject to interfacial reaction, which provides a potential source of reliability issues. The device 300 has both a relatively low and stable ON resistance, and a relatively high and stable OFF resistance; hence, it is relatively easy to interface with the intended circuit application(s), and latchless operation may be possible.

Figure 6:
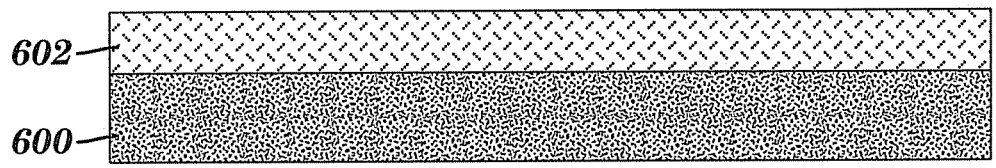
FIGS. 6 through 16 are a series of process flow diagrams illustrating exemplary integration techniques through which a PCM-based eFUSE device may be fabricated within a BEOL region of a semiconductor device, in accordance with an alternative embodiment of the invention.
Figure 7:
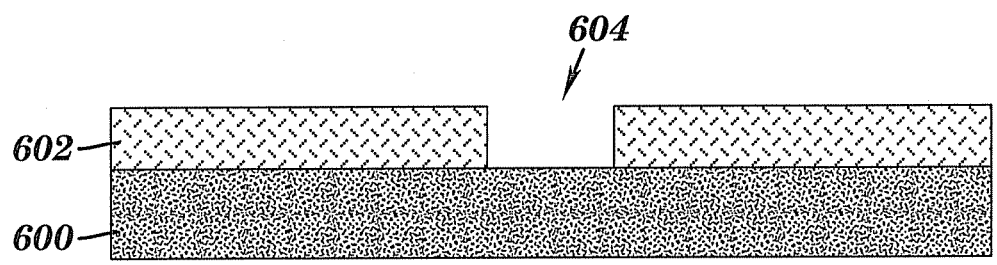
Figure 8:
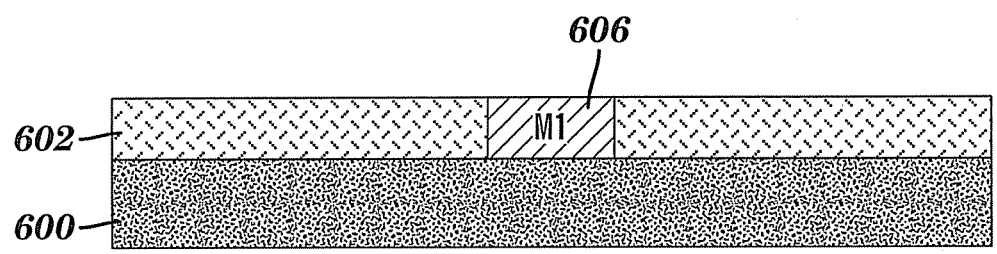
Figure 9:
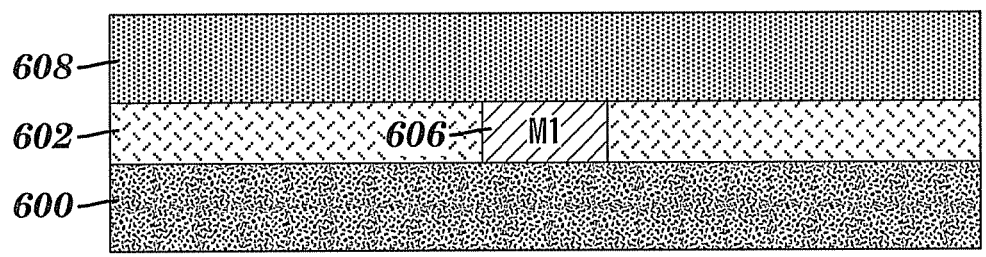

Finally, FIGS. 6 through 16 and FIGS. 17 through 26 are a series of process flow diagrams illustrating exemplary integration techniques through which the PCM-based eFUSE device may be fabricated within a BEOL region of a semiconductor device. Referring first to FIG. 6, a dielectric layer 602 (e.g., low-K material, $SiO_2$, SiN, etc.) is formed on a top (BEOL) layer 600 of a logic or memory chip. A trench (opening) 604 is patterned within dielectric layer 602, representing the opening (e.g., about 100 nm in depth) in which a metal for the lower electrode contact to the heater portion of the eFUSE device is to be formed, as shown in FIG. 7 (e.g., heater terminal h1 in FIG. 4). In FIG. 8, the trench is filled with an appropriate contact material 606 (e.g., W, Cu, TiW) through a Damascene process and thereafter planarized through chemical mechanical polishing (CMP). By way of example, the lower heater contact material 606 is shown formed at metal level M1 of the device, although a different starting location could also be used. This is followed by a relatively thin (e.g., about 500-1000 Å) dielectric layer 608 (e.g., $SiO_2$) used to electrically insulate contacts to the heater and the PCM, as shown in FIG. 9.

Figure 10:
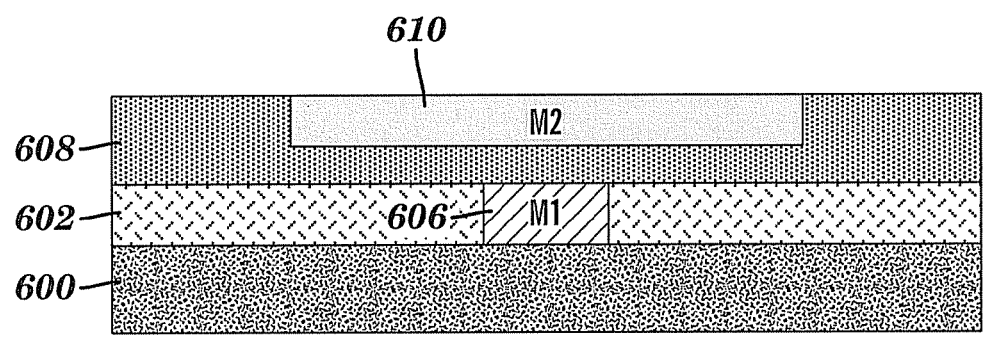

In FIG. 10, dielectric layer 608 is opened by patterning of a circular shaped trench for deposition of a lower fuse electrode contact metal 610 therein (e.g., W, TiW, Ti, etc.), and serves as an electrical contact for one end of the PCM fuse (e.g., fuse terminal "Out" in FIG. 4). As subsequently shown, the PCM will in turn surround the vertically disposed heater structure. It will be noted that the patterning in dielectric layer 608 is such that the lower fuse electrode contact metal 610 (at the M2 level, for example) does not extend all the way through layer 608 so as to remain electrically isolated from the metal of the lower heater electrode 606.

Figure 11:
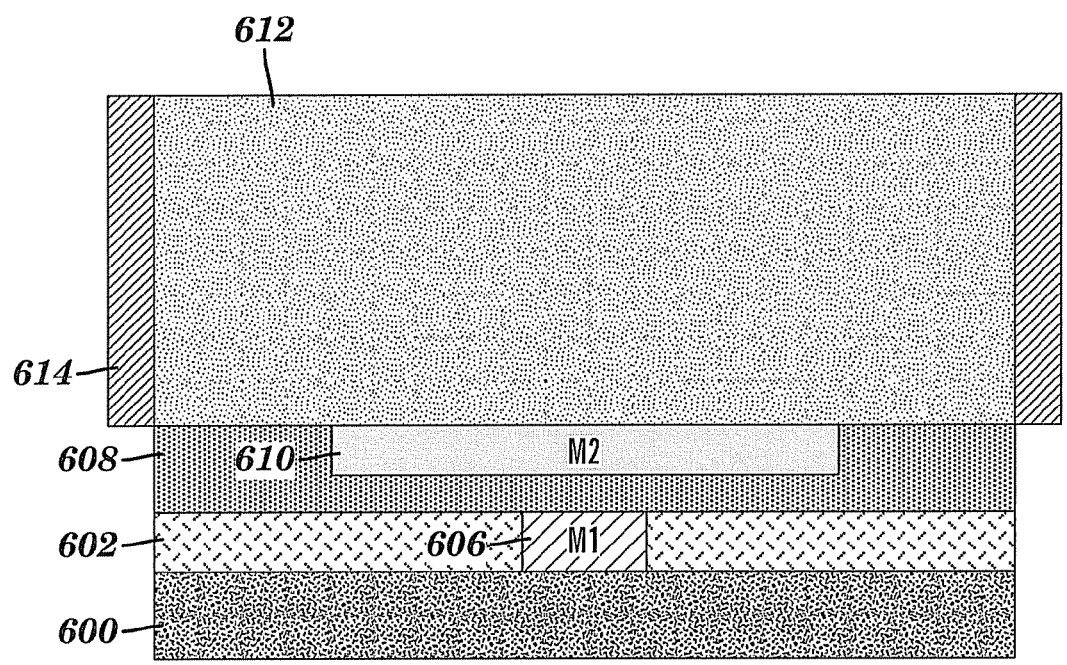
Figure 12:
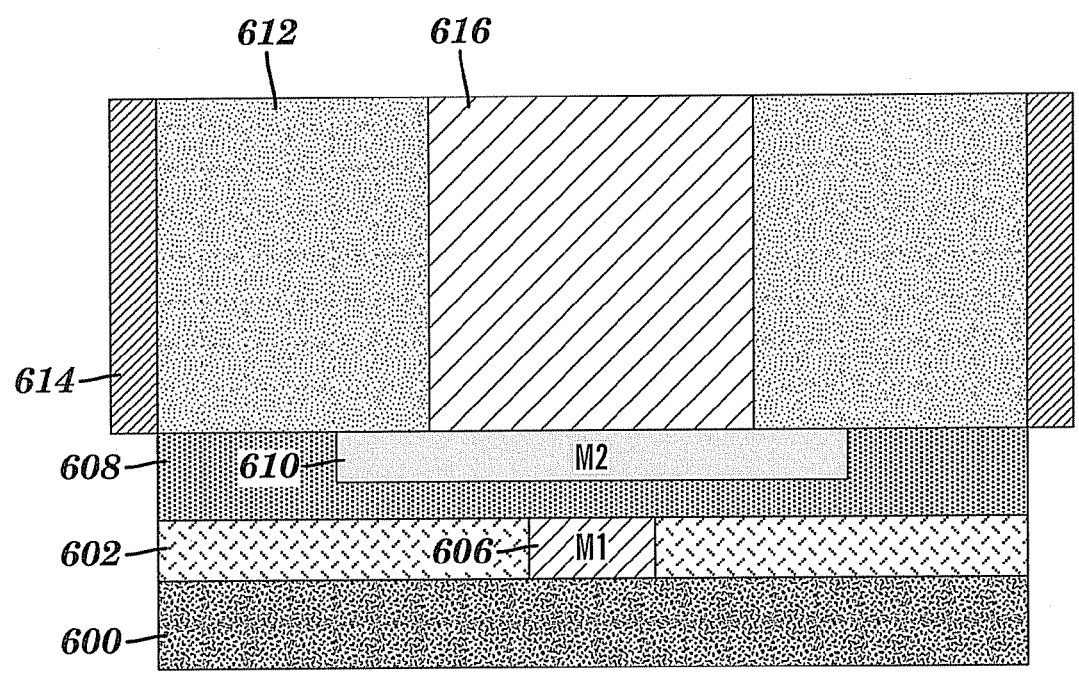

As shown in FIG. 11, a relatively thick (e.g., about 200-400 nm) thermally and electrically insulating material 612 (e.g., N-BLoK) is deposited within an opening formed in a low-K dielectric layer 614, which represents a region to be protected from the thermal effects of the heated PCM material. The low-K dielectric layer 614 and N-BLoK insulating material 612 are formed upon dielectric layer 608 and lower fuse electrode contact metal 610. Then, in FIG. 12, a portion of the N-BLoK insulating material 612 is itself patterned, etched down to the lower fuse electrode 610 and filled with a PCM 616, which is then planarized. Both the N-BLoK and PCM formation may be in accordance with Damascene processing techniques.

Figure 13:
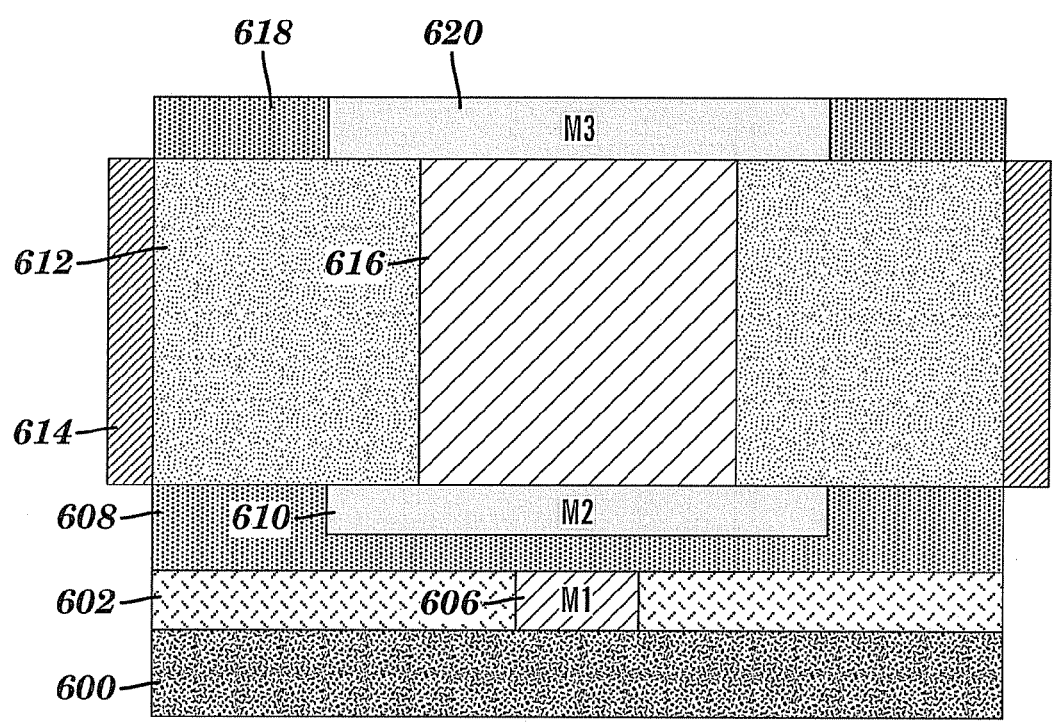
Figure 14:
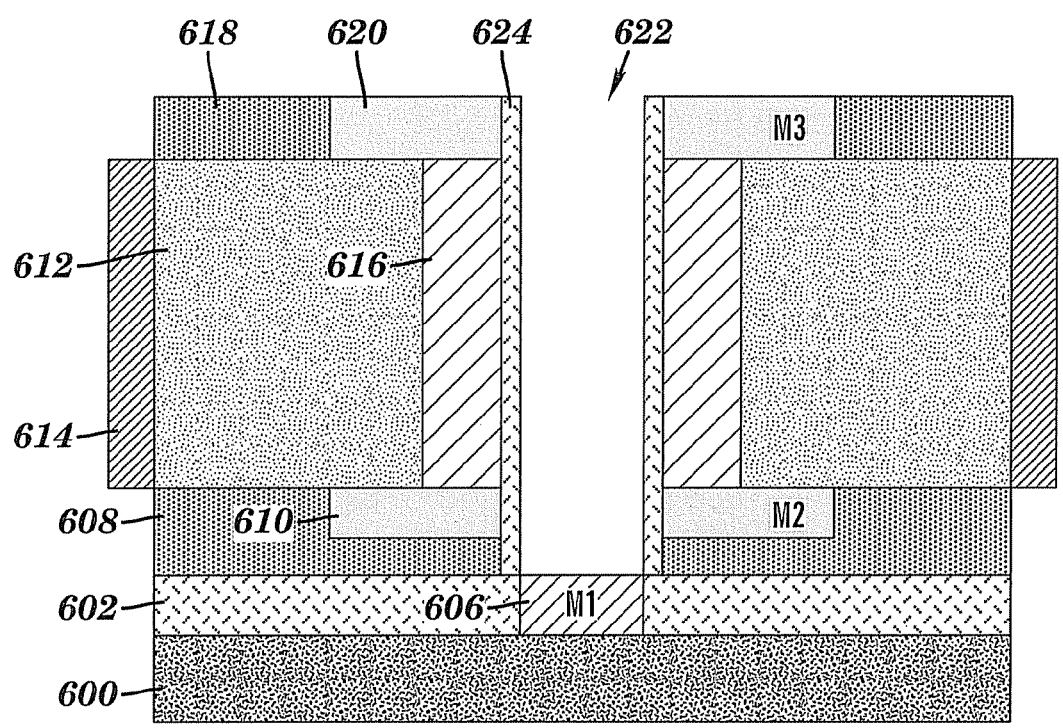

Proceeding to FIG. 13, another dielectric layer 618 (e.g., $SiO_2$) is formed over the N-BLoK insulating material 612 and PCM 616. The dielectric layer 618 is patterned, etched and filled with a conductive material (e.g., W, Cu, TiW) so as to form an upper fuse electrode 620 (at exemplary metal level M3). In the embodiment depicted, the shape of upper fuse electrode 620 has the same circular pattern as the lower fuse electrode 610. In FIG. 14, a high aspect ratio via 622 is etched (e.g., 4:1) through the upper fuse electrode 620, the PCM 616, the lower fuse electrode 610 and dielectric layer 608, stopping on the lower heater electrode 606. This is followed by a conformal deposition (e.g., atomic layer deposition (ALD), plasma assisted chemical vapor deposition PECVD)) of an electrically insulating liner material 624, such as an oxide of silicon, for example. The liner material 624 has an exemplary thickness of about 10 nm. There are a number of chemistries suitable for the conformal oxide deposition, some of which are listed below:

| $SiO_2$ | Chemistry | Deposition Temperature |
|---|---|---|
| TEOS | $Si(OC_2H_5)_4$ | 200° C. or 400° C. |
| Silane | Silane | 400° C. |
| OMCTS | SiCOH | 350° C. |
| Plasmatherm | Silane | 200° C.-400° C. |

As also shown in FIG. 14, a directional (anisotropic) etch is used to remove the portion of liner 624 initially formed over the exposed lower heater electrode 606. Then, in FIG. 15, the via 622 is filled (e.g., by blanket deposition) with a conductive heater material 626 capable of being cycled to about 1000° C. without deterioration in its electrical performance. In an exemplary embodiment, the heater material 626 is $Ta_xSi_yN_z$, wherein x, y and z may be tuned to adjust the resistivity and thermal coefficient of resistance to the range suitable for a desired application. For example, $Ta_{37}Si_{14}N_{49}$ has sheet resistance of about 40Ω/☐ at about 600° C., while $Ta_{29}Si_{25}N_{47}$ is more resistive, with $R_☐$ about 300Ω/☐ at the same temperature.

Figure 15:
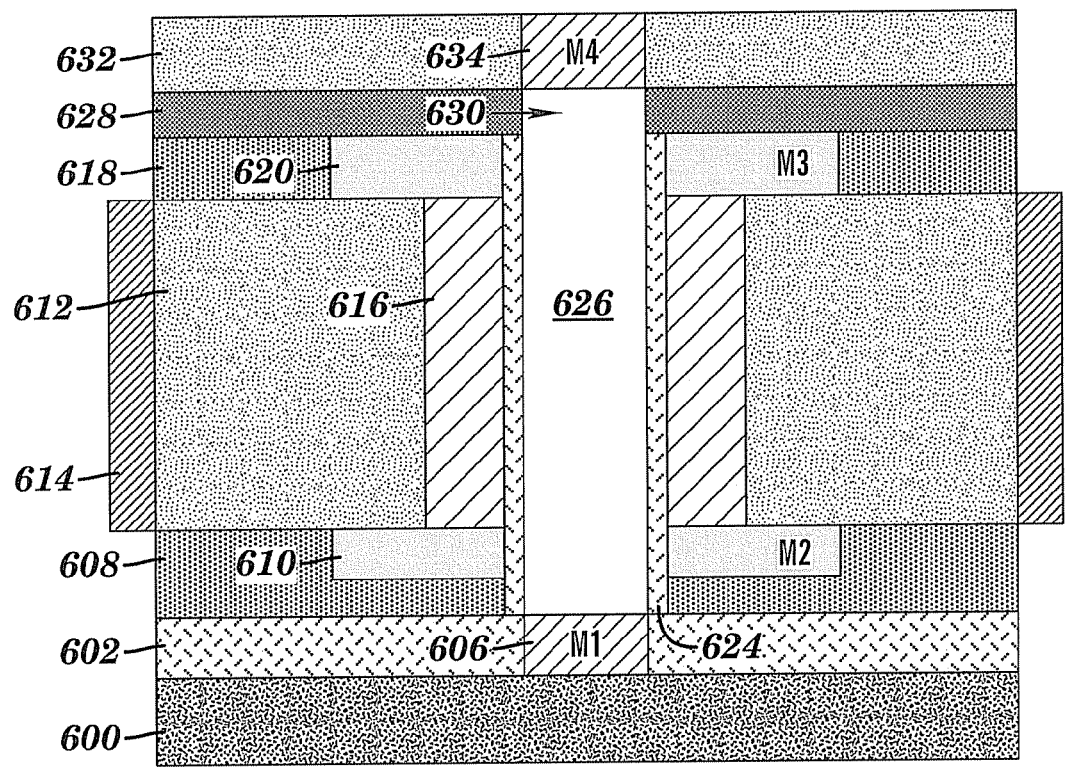

It will further be noted in FIG. 15 that the initial blanket deposition of heater material 626 is first planarized to the top of the upper fuse electrode 620 and dielectric layer 618. Then, to provide electrical isolation between the upper fuse electrode 620 and a subsequently formed upper heater electrode, another dielectric layer 628 (e.g., $SiO_2$) is formed over dielectric layer 618, upper fuse electrode 620 and heater material 626. The dielectric layer 628 is etched to re-expose the heater material 626 so that a heater extension 630 can be added thereto, by deposition and planarizing of additional $Ta_xSi_yN_z$. Following the formation of heater extension 630, a final dielectric layer 632 (e.g., $SiO_2$) is formed at metal level M4 over dielectric layer 628 and heater extension 630. The dielectric layer 632 is then etched and filled with a conductive material (e.g., W, Cu, TiW) to form the upper heater electrode contact 634.

Figure 16:
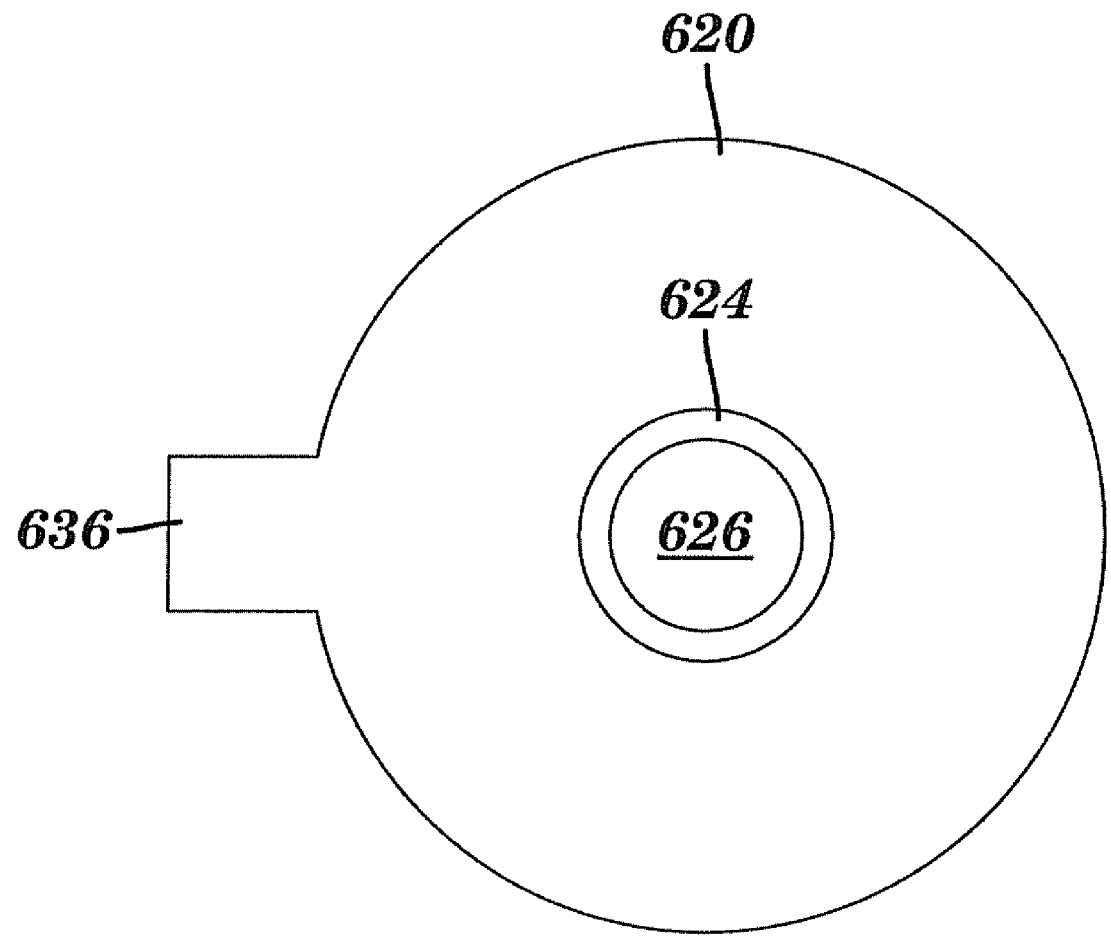

As described above, the cylindrical embodiment of the eFUSE device is characterized by circular cross sectional elements from a plan view perspective. FIG. 16 illustrates a top cross sectional view of the upper fuse electrode 620, electrically insulating liner 624 and heater material 626 at the M3 level in the above described process flow example. A landing area 636 may be included within the generally circular pattern of the fuse electrode 620 so as to provide contact to additional metal levels of the BEOL region of the device. A similar type of landing area can also be use for the lower fuse electrode 610 at the M2 wiring level.

In device applications where the footprint of the eFUSE is not a constraining factor, the entire structure may alternatively be constructed in a horizontal orientation with respect to the substrate. That is, the longitudinal axis of the heater element may be oriented on a single device level instead of being vertically disposed. Fabrication of such an exemplary embodiment is illustrated in FIGS. 17 through 26, wherein for those figures having (a) and (b) designations, the (a) sections represent side cross sectional views and the (b) designations are top views.

Figure 17:
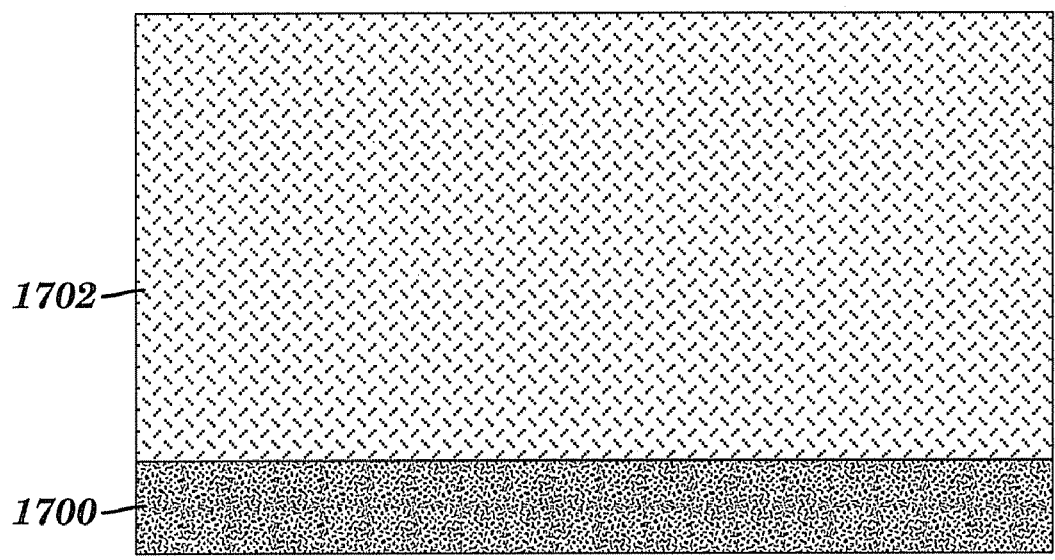
Figure 19B:
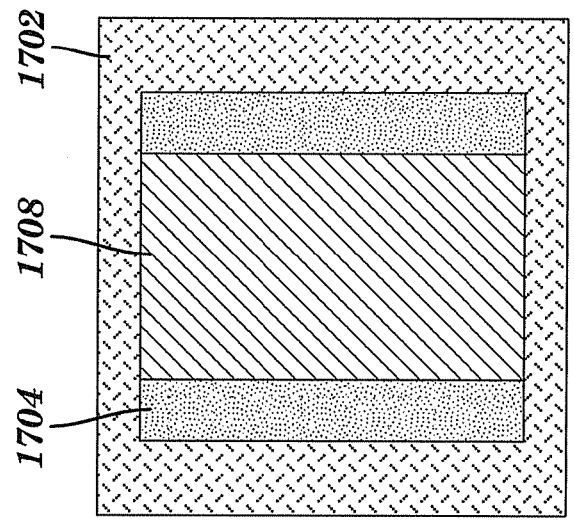
Figure 19A:
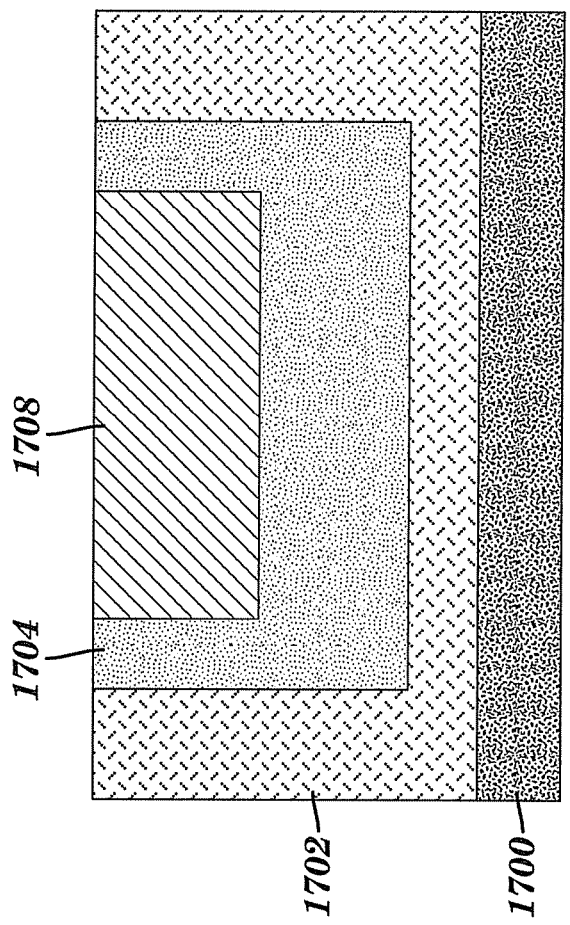

Referring now to FIG. 17, a low-K dielectric layer 1702 is formed on a top (BEOL) layer 1700 of a logic or memory chip. A trench is patterned within low-K dielectric layer in order to accommodate the thermally and electrically insulating material (e.g., N-BLoK) therein (not shown in FIG. 17), which is planarized after deposition. As then shown in FIG. 18(a), the N-BLoK layer 1704 is itself patterned and etched so as to form an opening 1706 that will accommodate a lower half of the eFUSE PCM material. FIG. 18(b) is a top view of FIG. 18(a). The deposition and planarization of PCM 1708 is shown in FIGS. 19(a) and 19(b).

Figure 20A:
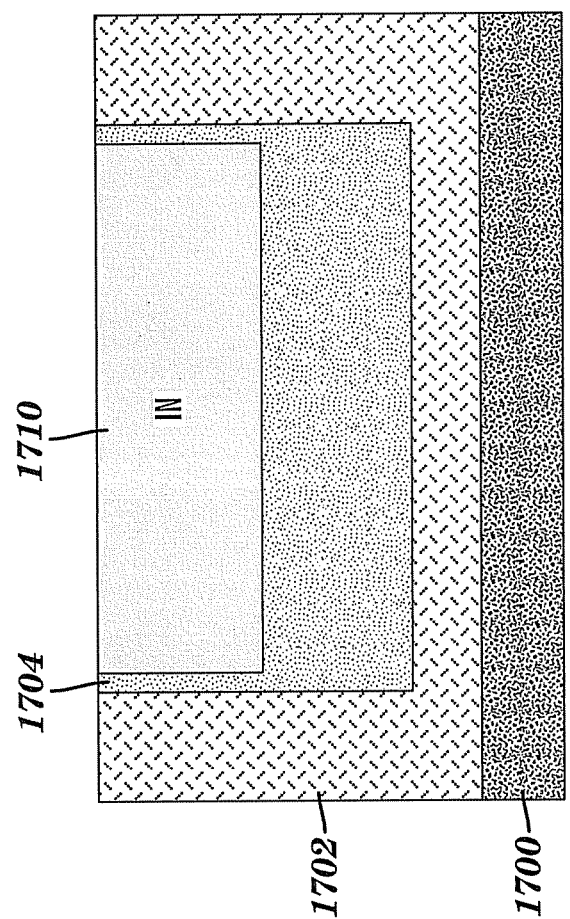
Figure 20B:
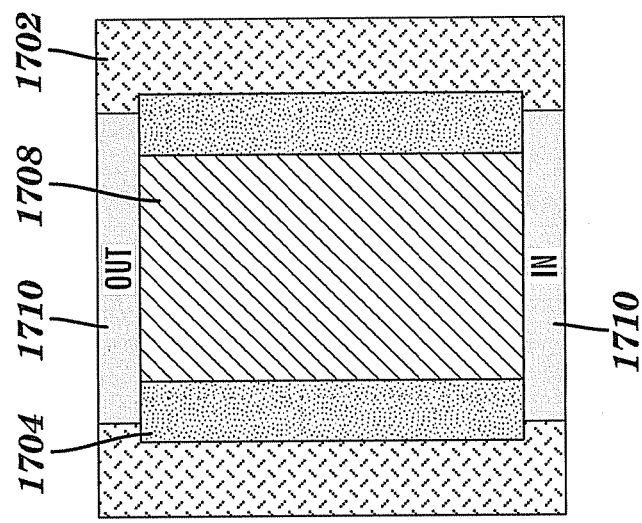
Figure 21B:
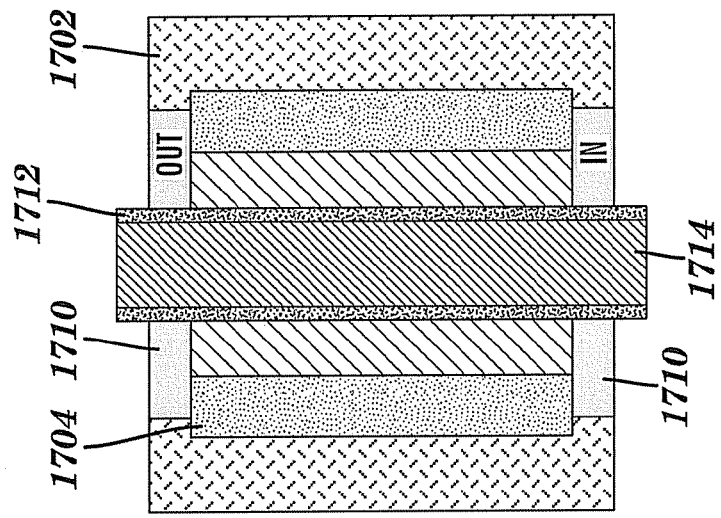
Figure 21A:
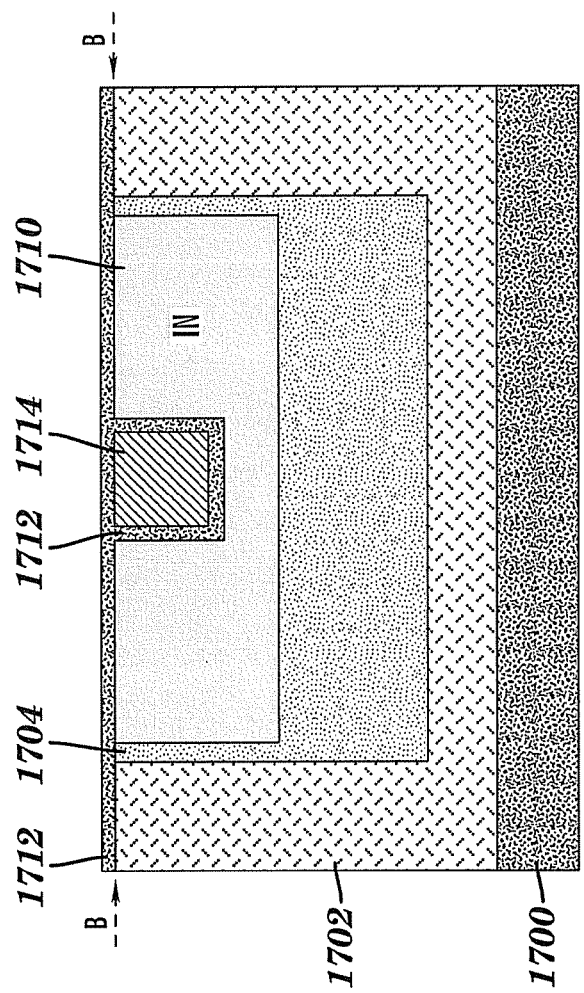

Proceeding to FIGS. 20(a) and 20(b), fuse contact electrodes 1710 "In" and "Out" are formed at opposing ends of the PCM 1708 and N-BLoK layer 1704. Again, in contrast to the earlier depicted embodiment, both terminals of the fuse device are disposed at the same device level. Then, as shown in FIGS. 21(a) and 21(b), an elongated heater trench is formed within the PCM 1708, and extending completely through the fuse contact electrodes 1710. The heater trench is filled with an electrically insulating liner material 1712 (e.g., ALD of $SiO_2$) followed by filling of the heater material 1714 (e.g., $Ta_xSi_yN_z$). Once the heater material 1714 is planarized, additional liner material 1712 can then be deposited in order to completely encapsulate the heater material 1714. For purposes of clarity, FIG. 21(b) is taken along the arrows "B" in FIG. 21(a) so as to only illustrate the trench portion of the liner material 1712.

Figure 23:
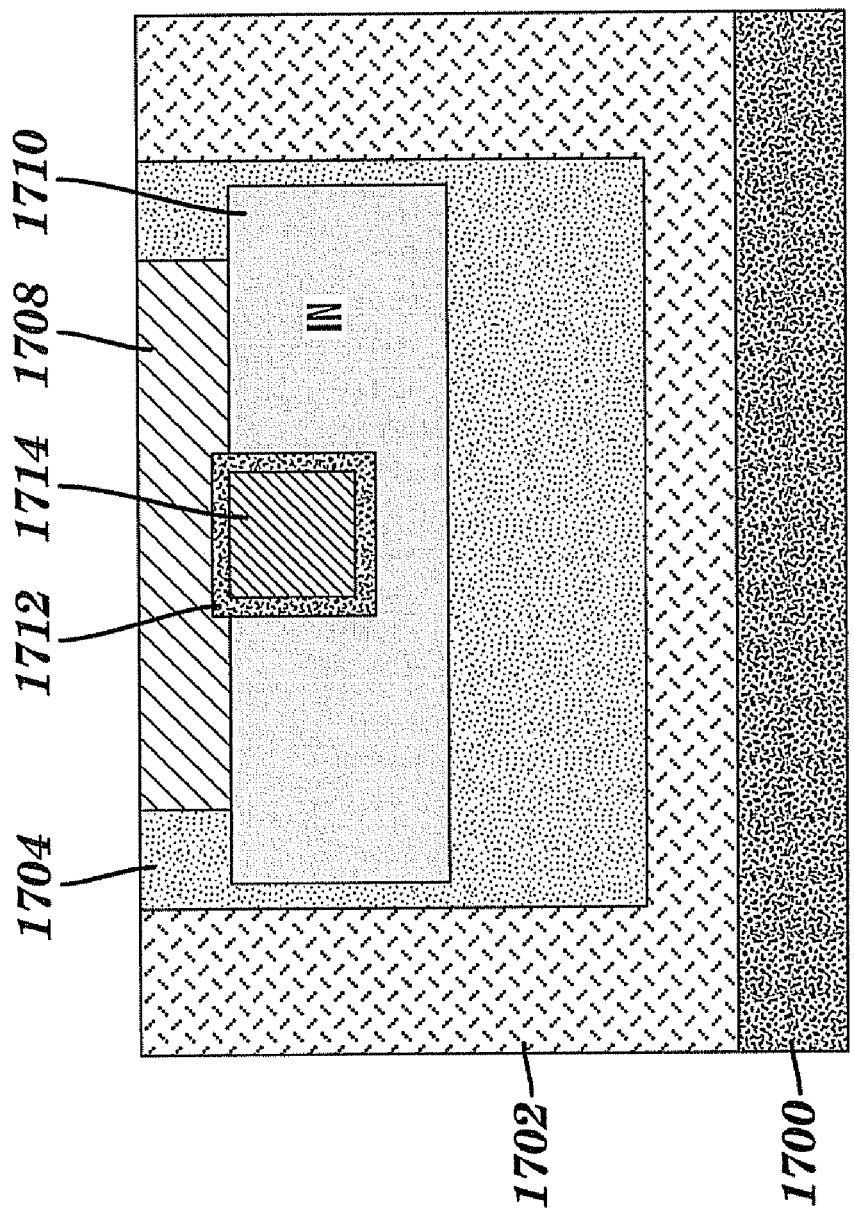
Figure 24:
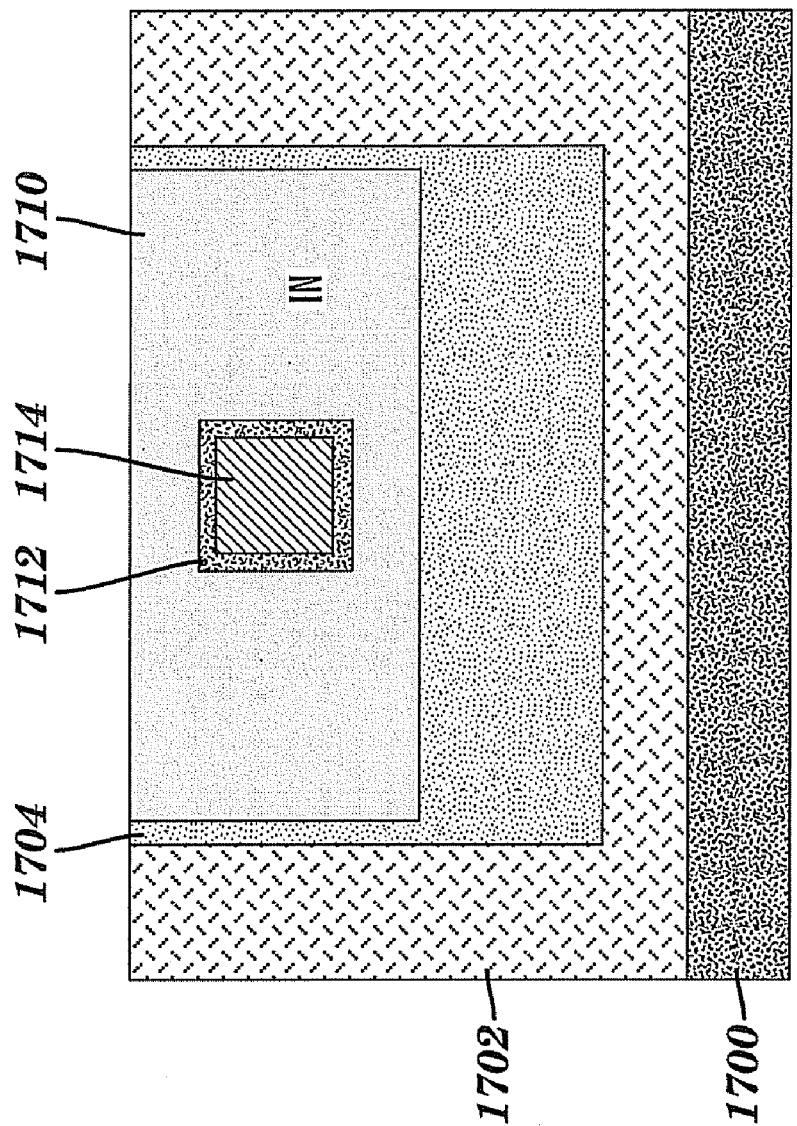
Figure 25:
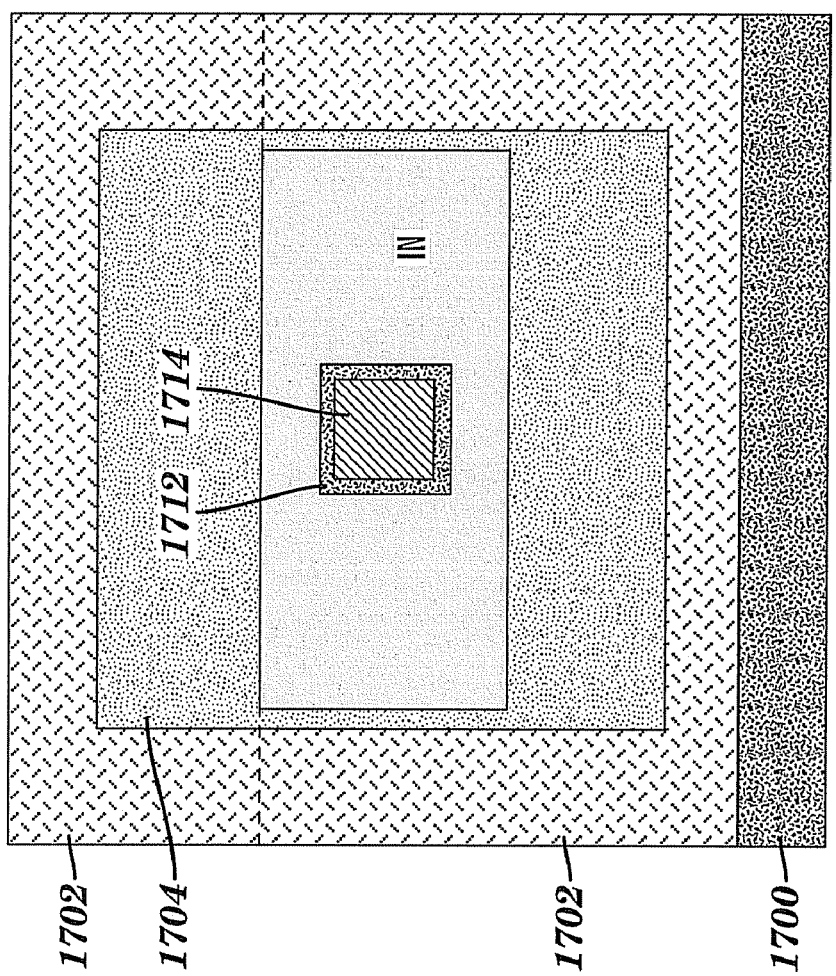

As then shown in FIGS. 22(a) and 22(b), the portions of liner material not directly surrounding the heater material 1714 are removed. This can be accomplished, for example, etching through the mask used to pattern the heater trench. Referring now to FIG. 23, the steps outlined in FIGS. 17-19 are repeated in order to create an additional height of low-K dielectric 1702, N-BLoK layer 1704 and PCM 1708. This is followed by an additional build of fuse electrode material 1710 in FIG. 24 to coincide with the added height created in FIG. 23. Then, in FIG. 25, another additional height of low-K dielectric 1702 and N-BLoK 1704 is added above the final height of the fuse electrode material 1710 and PCM 1708 (marked by the dashed line), followed by a top layer of low-K dielectric 1702 to cover the final height of the N-BLoK 1704. Accordingly, it will be seen that with respect to the longitudinal axis of the heater 1714, the low-K material 1702 surrounds the N-BLoK 1704, which in turn surrounds the PCM 1708 (obscured by the "IN" fuse electrode 1710 in FIG. 26), which in turn surrounds the liner material 1712, which in turn surrounds the heater material 1714.

Finally, as shown in FIGS. 26(a) and 26(b), vertical vias 1716 are formed within the structure in order to provide BEOL wiring contacts to the fuse electrodes 1710, as well as to the ends of the heater (i.e., H1, H2). It will also be noted that the top view of FIG. 26(b) is taken along the multiplanar line B-B in FIG. 26(a) in order to illustrate each of the different materials in the device.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrically re-programmable fuse (eFUSE) device for use in integrated circuit devices, comprising:
    an elongated heater element;
    an electrically insulating liner surrounding an outer surface of the elongated heater element, corresponding to a longitudinal axis thereof, leaving opposing ends of the elongated heater element in electrical contact with first and second heater electrodes;
    a phase change material (PCM) surrounding a portion of an outer surface of the electrically insulating liner;
    a thermally and electrically insulating layer surrounding an outer surface of the PCM; and
    first and second fuse electrodes in electrical contact with opposing ends of the PCM;
    wherein the PCM is encapsulated within the electrically insulating liner, the thermally and electrically insulating layer, and the first and second fuse electrodes.

2. The eFUSE device of claim 1, wherein the first and second heater electrodes are electrically insulated from the first and second fuse electrodes.

3. The eFUSE device of claim 1, wherein the PCM is one of: a ternary alloy of germanium (Ge), antimony (Sb) and tellurium (Te) (GST), and a compound of Ge and Sb.

4. The eFUSE device of claim 1, wherein the heater element is formed from $Ta_xSi_yN_z$, wherein x, y and z is selectively adjustable for tuning resistivity and thermal coefficient of resistance of the heater element.

5. The eFUSE device of claim 1, wherein the thermally and electrically insulating layer has a thermal conductivity of about 0.008 Watt $cm^{-1}$ $K^{-1}$ or less.

6. The eFUSE device of claim 5, wherein the thermally and electrically insulating layer comprises a compound of Si—C—H—N or a material having a substantially similar thermal and electrical conductivity and a substantially similar resistance to thermal cycling.

7. The eFUSE device of claim 6, wherein the electrically insulating liner comprises $SiO_2$.

8. An integrated circuit device, comprising:
    an electrically re-programmable fuse (eFUSE) device formed within a back end of line (BEOL) region of the integrated circuit device, the eFUSE device further comprising:
        an elongated heater element;
        an electrically insulating liner surrounding an outer surface of the elongated heater element, corresponding to a longitudinal axis thereof, leaving opposing ends of the elongated heater element in electrical contact with first and second heater electrodes;
        a phase change material (PCM) surrounding a portion of an outer surface of the electrically insulating liner;
        a thermally and electrically insulating layer surrounding an outer surface of the PCM; and
        first and second fuse electrodes in electrical contact with opposing ends of the PCM;
        wherein the PCM is encapsulated within the electrically insulating liner, the thermally and electrically insulating layer, and the first and second fuse electrodes so as to protect dielectric material within the BEOL region from operating temperatures generated by the heater element as a result of programming of the eFUSE device.

9. The integrated circuit device of claim 8, wherein the first and second heater electrodes are electrically insulated from the first and second fuse electrodes.

10. The integrated circuit device of claim 8, wherein the PCM is one of: a ternary alloy of germanium (Ge), antimony (Sb) and tellurium (Te) (GST), and a compound of Ge and Sb.

11. The integrated circuit device of claim 10, wherein the heater element is formed from $Ta_xSi_yN_z$, wherein x, y and z is selectively adjustable for tuning resistivity and thermal coefficient of resistance of the heater element.

12. The integrated circuit device of claim 11, wherein the thermally and electrically insulating layer comprises a compound of Si—C—H—N or a material having a substantially similar thermal and electrical conductivity and a substantially similar resistance to thermal cycling.

13. The integrated circuit device of claim 12, wherein the electrically insulating liner comprises $SiO_2$.

14. The integrated circuit device of claim 8, wherein the eFUSE device is configured to facilitate conversion of the PCM material between a resistive, amorphous state and a conductive, crystalline state at a heater current of 2 mA or less.

15. The integrated circuit device of claim 8, wherein the eFUSE device is configured to facilitate conversion of the PCM material between a resistive, amorphous state and a conductive, crystalline state during a programming of about 500 ns or less.

16. The integrated circuit device of claim 8, wherein the longitudinal axis of the heater element is horizontally disposed within the BEOL region such that the first and second heater electrodes are located within the same metal level with respect to one another.

17. The integrated circuit device of claim 8, wherein the longitudinal axis of the heater element is vertically disposed within the BEOL region such that the first and second heater electrodes are located within different metal levels with respect to one another.

* * * * *